United States Patent [19]
Brunolli

[11] Patent Number: 5,325,001
[45] Date of Patent: Jun. 28, 1994

[54] NEGATIVE FEEDBACK SENSE PRE-AMPLIFIER

[75] Inventor: Michael J. Brunolli, Escondido, Calif.

[73] Assignee: Brooktree Corporation, San Diego, Calif.

[21] Appl. No.: 909,074

[22] Filed: Jul. 2, 1992

[51] Int. Cl.$^5$ .................... G01R 19/00; G11C 7/00
[52] U.S. Cl. .................... 307/530; 365/208; 365/220
[58] Field of Search .................... 307/530; 365/189.01, 365/189.04, 207, 208, 220

[56] References Cited

U.S. PATENT DOCUMENTS

| | | | |
|---|---|---|---|
| 4,553,053 | 11/1985 | Ong et al. | 307/530 |
| 4,813,023 | 3/1989 | Brunolli | 365/207 |
| 4,949,306 | 8/1990 | Nakagome | 365/189.01 |
| 5,189,322 | 2/1993 | Chan et al. | 307/530 |

OTHER PUBLICATIONS

Donofrio et al., "Differential Shunt Feedback Sense Amplifier", *IBM Technical Disclosure Bulletin*, vol. 12, No. 12, May, 1970, p. 2123.

Primary Examiner—James B. Mullins
Attorney, Agent, or Firm—Ellsworth R. Roston; Charles H. Schwartz

[57] ABSTRACT

A static RAM cell having first and second differentially connected lines reads binary information stored in the cell by providing a current through the cell and the first line to read a binary "1" or through the cell and the second line to read a binary "0". First and second transistors in a pre-amplifier respectively connected in the first and second lines provide outputs respectively representing a binary "1" and a binary "0". The first and second transistors pass control currents respectively through third and fourth transistors to produce bias currents in one of the first and second transistors when reading currents are not passing through that transistor and the cell. The control of the third and fourth transistors increases the frequency at which information is read from the cell and is amplified. In this improvement, the bias current in the line providing an output at each instant is reduced by respectively providing a negative feedback from the outputs (e.g. the drains) of the first and second transistors to control the inputs (e.g. the gates) of the third and fourth transistors. This reduces power losses while increasing the frequency at which binary information is read from the cell. The frequency may be further increased by including an impedance in the control circuitry to the third and fourth transistors to delay the response of the third and fourth transistors. Pairs of pre-amplifiers for different bit and word lines may be connected in parallel to provide further increases in the frequency response and further power losses.

38 Claims, 4 Drawing Sheets

NEGATIVE FEEDBACK SENSE PRE-AMPLIFIER

This invention relates to static RAM cells and more particularly to pre-amplifiers associated with such static RAM cells. The invention particularly relates to pre-amplifiers which operate in conjunction with static RAM cells to provide an enhanced frequency response with reduced power consumption.

Work stations and personal computers include a display monitor (e.g. a television tube) to display the results of computations in such work stations and personal computers. The displays are formed by a plurality of isolated pixels much as an artist produces a visual image by a plurality of closely spaced, but isolated, dots on a canvas. The resolution of the image (e.g. the fidelity of reproduction) of an image is dependent upon the number of pixels on a screen. For example, resolutions of 1280 pixels on a display monitor are now common in work stations and high priced personal computers. Since each image is formed on the display monitor from two (2) interlaced frames and the frames are reproduced on the display monitor at a rate of sixty (60) times per second, the pixel information has to be provided at frequencies in excess of 125 megahertz to obtain a reproduction of the image on the display monitor.

In the display systems in work stations and personal computers, look-up tables are provided. The look-up tables effectively constitute a memory in which information representing different colors are stored at different positions in the memory. The color at each position is represented by three (3) sequences of binary bits respectively representing the characteristics of the primary colors red, green and blue. The color stored at each position is obtained by converting each of the three (3) sequences of binary bits to a corresponding analog value and by mixing the colors represented by such analog values to reproduce the color. The color stored at each individual position in the look-up table (the memory) may be replaced by a new color at any time in accordance with instructions from a microprocessor.

The color information stored in binary form in the look-up table for each memory position is retained in static RAM cells. Each static RAM cell stores one binary bit of the binary information for a color at an individual position in the look-up table. When each primary color in the look-up table is represented by eight (8) binary bits and there are 256 memory positions in the look-up table, a total of 6144 static RAM cells is provided in the look-up table to store the colors.

The colors in the look-up table are accessed by providing a display memory. The display memory stores information in binary form for each of the successive pixels in the display memory. This information represents the particular one of the memory positions (e.g. 256) in the look-up table to be addressed for each of the successive pixels in the display monitor. The memory positions in the look-up table are addressed by the display memory to determine the color information to be transferred from the look-up table to each successive pixel position in the display monitor.

Each static RAM cell is constructed to read the binary information in the cell. Preferably the cell has two lines which are differentially connected to provide complementary signals. A current passes through the cell and one of the lines if a binary "1" is stored in the cell and the current passes through the cell and the other line if a binary "0" is stored in the cell. The amplitude of this current is relatively low. In order to convert the binary information read from the cell to a level where it can be processed with other binary bits representing a color, information represented by the cell current has to be amplified. Until recently, the amplification has limited the frequency at which the information in the cell can be converted with related binary bits of information in the source word to a corresponding analog value. The amplification has also resulted in power losses.

In U.S. Pat. No. 4,905,189 issued to me on Feb. 27, 1990, for a "System for Reading and Writing Information" and assigned of record to the assignee of record of this application, a static RAM cell and pre-amplifier and amplifier stages associated with the cell are disclosed and claimed. The static RAM cell is advantageous in that it provides for reading information from the cell at high frequencies at the same time that information is being written in the cell, or read from the cell, by a microprocessor. The cell is constructed so that the reading from the cell at high frequencies does not affect the writing of information into, or the reading of information from, the cell by the microprocessor even when these operations occur simultaneously. The pre-amplifiers and amplifiers in U.S. Pat. No. 4,905,189 co-operate with the cell to enhance the frequency at which the information is read from the cell for conversion with related binary information into corresponding analog values.

This invention provides the combination of a static RAM cell with an improved pre-amplifier to enhance, even above that provided by the circuitry in U.S. Pat. No. 4,905,189, the frequency at which information is read from the cell. The cell and the pre-amplifier are able to enhance the response frequency while reducing the rate of power consumption in the cell. The invention also provides for an interrelationship between the pre-amplifiers in different cells to enhance even further the frequency of response of the interrelated cells and reduce even further the power consumption in the interrelated cells.

In one embodiment of the invention, a static RAM having first and second differentially connected lines reads binary information stored in the cell by providing a current through the cell and the first line to read a binary "1" or through the cell and the second line to read a binary "0". First and second transistors in a preamplifier respectively connected in the first and second lines provide outputs respectively representing a binary "1" and a binary "0". The first and second transistors pass control currents respectively through third and fourth transistors to produce bias currents in one of the first and second transistors when read currents are not passing through that transistor and the cell. The control of the third and fourth transistors increases the frequency at which information is read from the cell and is amplified at any given total cell and read line bias current.

In this improvement, the bias current in the line passing a cell current output at each instant is reduced by respectively providing a negative feedback from the outputs (e.g. the drains) of the first and second transistors to control the inputs (e.g. the gates) of the third and fourth transistors. This reduces power losses while increasing the frequency at which binary information is read from the cell. The frequency may be further increased by including an impedance in the control circuitry to the third and fourth transistors to delay the response of the third and fourth transistors.

Pairs of pre-amplifiers for different bit and word lines may be connected in parallel to provide further increases in the frequency response. The interconnections are such that certain components can be eliminated as duplicative, and only one circuitry cell on the pair of lines passes read current, thereby reducing power consumption even further and enhancing the frequency of response for the coupled pre-amplifiers.

In the drawings:

FIG. 2a shows voltage waveform at strategic terminals in the pre-amplifier stage shown in FIG. 2, the strategic terminals shown in FIG. 2a corresponding to the strategic terminals shown in FIG. 1a;

Figure 1:
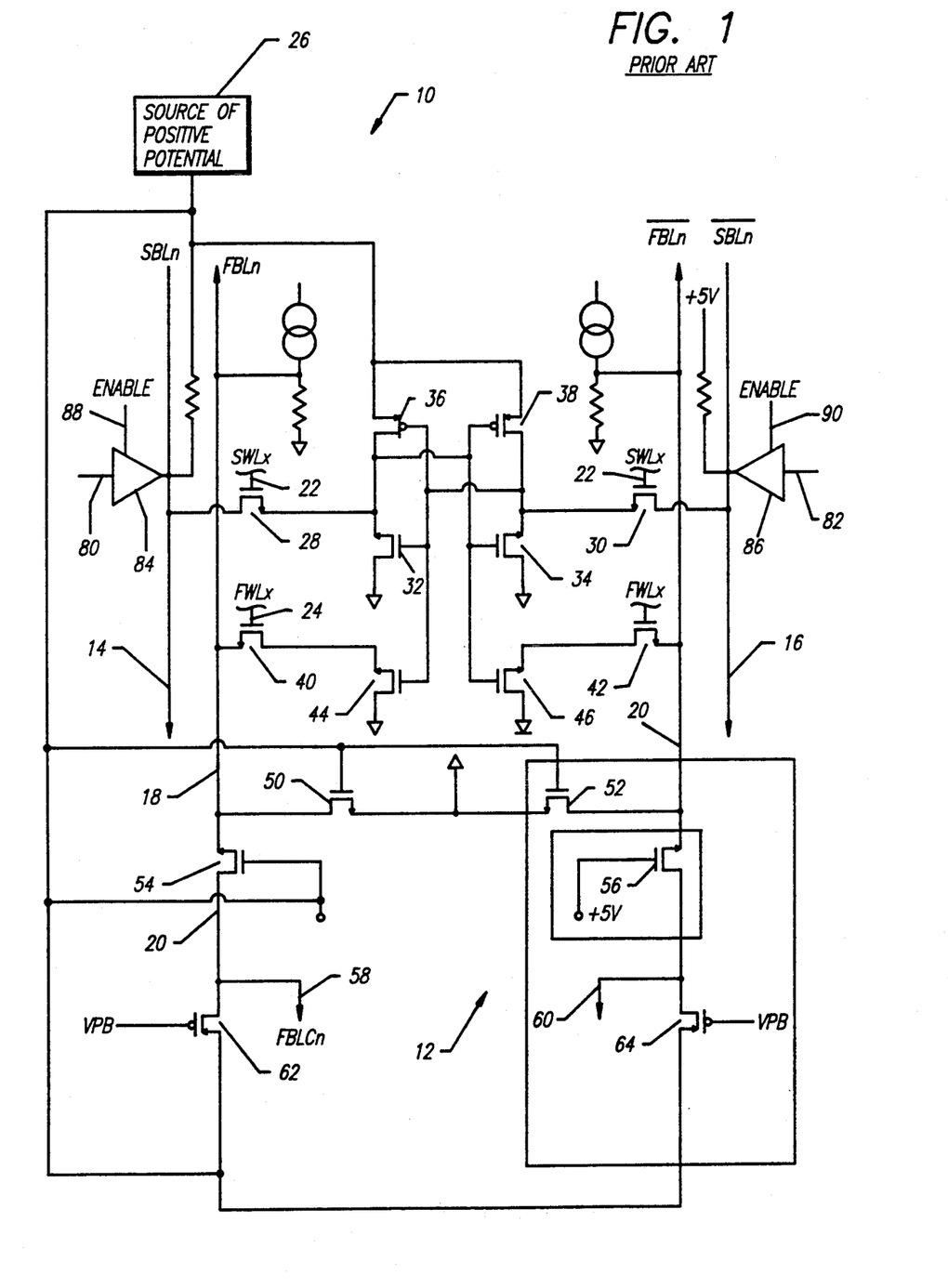
FIG. 1 is a circuit diagram of a prior art static RAM cell and a pre-amplifier stage associated with such static RAM cell for reading and amplifying information in the cell at a high frequency without losing any information in the cell.

FIG. 1 shows a static RAM cell (generally indicated at 10) and a pre-amplifier stage (generally indicated at 12) which are disclosed and claimed in U.S. Pat. No. 4,905,189. The static RAM cell 10 and the pre-amplifier 12 may be fabricated from CMOS circuitry but other types of circuitry may be used. The static RAM cell 10 includes lines 14 and 16 (also designated as "$SBL_n$" and "$\overline{SBL_n}$") and fast bit lines 18 and 20 (also designated as "$FBL_n$" and "$\overline{FBL_n}$"). The static RAM cell 10 also includes a line 22 (designated as "SWL") and a line 24 (designated as "FWL"). The lines 14 and 16 provide complementary bit information for a slow bit line and the lines 18 and 20 provide complementary bit information for a fast bit line. The line 22 provides information for a slow bit word and the line 24 provides information for a fast bit word. The slow bit word 24 and the slow bit lines 14 and 16 provide for the recording of binary information into the cell 10 from a microprocessor (not shown) or the reading of information in the cell to the microprocessor. The fast wordline 24 and the fast word lines 18 and 20 provide for a reading of information from the cell 10 for conversion to analog colors on a video screen (not shown).

The slow bit lines 14 and 16 receive a positive energizing potential (e.g. +5 V) from a source 26 and are respectively connected to the drains of transistors 28 and 30, which may be n-type transistors. The gates of the transistors 28 and 30 are common with the slow word line 22. The source of the transistor 28 is respectively common with the source of a transistor 32, the drain of a transistor 36 and the gates of transistors 34 and 38. The transistors 32 and 34 may be n-type transistors and the transistors 36 and 38 may be p- type transistors. The gates of the transistors 32 and 36, the source of the transistor 34 and the drain of the transistor 38 are connected to the source of the transistor 30. The sources of the transistors 36 and 38 receive an energizing voltage from the source 26 and the drains of the transistors 32 and 34 are common with a reference potential such as ground.

The sources of transistors 40 and 42 are respectively connected to the complementary fast bit lines 18 and 20. The transistors 40 and 42 may be n- type transistors. The gates of the transistors 40 and 42 receive the voltage on the fast word line 24. Connections are respectively made from the drains of the transistors 40 and 42 to the sources of transistors 44 and 46, which may be of the p-type. The gates of the transistors 44 and 46 may be respectively common with the sources of the transistors 34 and 32. The drains of the transistors 44 and 46 may receive the reference potential such as ground.

The complementary fast bit lines 18 and 20 extend respectively to the drains of transistors 50 and 52, both of which may be of the n- type. The transistors 50 and 52 are included in the pre-amplifier 12. The transistors 50 and 52 are included in the pre-amplifier 12. The gates of the transistors 50 and 52 receive a positive bias voltage from the source 26. The drains of the transistors 50 and 52 may be at the reference potential such as ground. The complementary fast bit lines 18 and 20 are also respectively connected to the sources of transistors 54 and 56, which may be of the n-type. The gates of the transistors 54 and 56 are positively biased from the source 26. The drains of the transistors 54 and 56 are respectively common with output lines 58 and 60 and with the drains of transistors 60 and 62, which may be of the p- type. The gates of the transistors 62 and 64 receive a bias voltage (VPB) to produce a regulated flow of current of a low amplitude through the transistors. The positive voltage from the source 26 is applied to the sources of the transistors 62 and 64.

To write binary information into the static RAM cell 10 from the microprocessor through the slow bit lines 14 and 16, signals are respectively applied to lines 80 and 82 to represent a binary "1" and a binary "0". When an amplifier 84 is enabled by a signal on a line 88, a signal representing a binary "1" is applied to the slow bit line 14 through the amplifier. This signal causes the transistor 28 to become conductive when the gate of the transistor receives a high voltage from the associated word line 22. Current accordingly flows through a circuit including the transistors 28 and 32 and produces a low voltage on the source of the transistor 28. The low voltage approaching ground on the source of the transistor 32 produces a state of conductivity on the gate of the transistor 38 so that the voltage on the drain of the transistor is relatively high.

In like manner, the transistor 30 becomes conductive when a binary "0" is to be written into the static RAM cell 10 through an amplifier 86 at the time that the word line has been activated by a voltage on the line 22. This voltage produces a conductivity in the transistor 30, which in turn causes a low voltage to be produced on the source of the transistor 34. This low voltage causes the transistor 36 to become conductive and a high voltage to be produced on the drain of the transistor. The transistors 32, 34, 36 and 38 act as a latching circuit to store, in the voltages on the drains of the transistors 36 and 38, the information written into the cell 10 from the microcomputer (not shown) through the complementary slow bit lines 14 and 16.

When the information latched into the cell 10 by the latching network is to be read, a positive signal is applied to the word line 24. This causes the transistors 40 and 42 to become conductive. However, only one of these transistors conducts depending upon the latched state of the transistors 32, 34, 36 and 38. For a binary "0", the positive voltages on the source of the transistor 44 and the drain of the transistor 38 cause the transistor 44 to become conductive and current to flow through a circuit including the transistors 40 and 44 and the line 18. This current produces a relatively low voltage on the line 18.

In like manner, a low voltage is produced on the line 20 when a binary "1" is read from the latching network formed by the transistors 32, 34, 36 and 38. This results from the fact that high voltages are introduced to the source and gate of the transistor 46 by states of conductivity in the transistors 42 and 36 to make the transistor 46 conductive. The resultant low voltage on the line 20 indicates a binary "1". The signals produced in the lines 18 and 20 as a result of a flow of currents through the lines are used to provide a digital-to-analog conversion for the display of color on a display monitor (not shown).

The static RAM cell 10 has certain important advantages. For example, the transistors 44 and 46 operate as isolating transistors which prevent any reading of binary information through the lines 18 and 20 from the latch formed by the transistors 32, 34, 36 and 38 from affecting the simultaneous writing of binary information into such latch from the microcomputer. In this way, correct information is recorded in the latching network at all times from the microprocessor, even when information is being read from the cell through the lines 18 and 20 simultaneously with the writing of information into the cell 10 through the lines 14 and 16. The cell 10 is also advantageous in that it operates on a differential basis in reading information through the lines 18 and 20 and writing information through the lines 14 and 16. This increases the sensitivity of response of the cell 10.

It will be appreciated that information can be read from the cell 10 through the lines 14 and 16 to the microcomputer to verify the information previously read in the cell and that the reading of information through these lines is not affected by the simultaneous reading of information through the lines 18 and 20. The reading of information through the lines 18 and 20 provides color information for pixels in a video monitor. The reading of information through the lines 14 and 16 is provided to verify information previously recorded in the cell 10 from the microprocessor.

The signals read from the cell 10 by the currents through the fast bit lines 18 and 20 are introduced to the sources of the transistors 54 and 56 to produce a flow of current through these transistors. For example, when current flows through the transistors 40 and 44 to indicate a binary "0", a resultant voltage approaching ground is produced on the line 18. This low voltage causes current to flow through a circuit including the source 26 and the transistors 62 and 54 to produce a low voltage on the output line 58. In like manner, a low voltage is produced on the output line 60 to represent a binary "1". This low voltage is produced by a flow of current through a circuit including the transistors 64 and 56.

The transistors 50 and 52 are respectively included in circuits with the transistors 54 and 56 to increase the frequency of response of the pre-amplifier 12. The transistors 62 and 64 are biased to produce currents which are fractional magnitudes (such as ½) of the current flowing in the line 18 to represent a binary "0" and in the line 20 to represent a binary "1". This biasing current flows through the transistors 50 and 52 to the reference potential such as ground. These currents enhance the transconductances in the transistors 54 and 56 to decrease the time for reading the binary information in the latching network defined by the transistors 32, 34, 36 and 38. The transistors 50 and 52 provide this frequency enhancement by providing a common mode rejection of the signals common to the lines 18 and 20.

High frequencies well in excess of one hundred megahertz (100 Mhz) have been attained by the static RAM cell 10 and the pre-amplifier 12 shown in FIG. 1. However, the advantages of such static RAM and such pre-amplifier have been found to be limited with the passage of time. For example, increases in frequency to as high as three hundred megahertz (300 Mhz) have recently been required to enhance the resolution of the image in display monitors which are included in work stations and personal computers. Furthermore, the number of cells in a look-up table is being constantly increased to increase the number of bits which are provided at each memory location in the look-up table. The increased number of bits is provided to indicate with an enhanced resolution the binary values of the primary colors at such memory position. For example, the number of bits for the primary color red in one of the positions in the look-up table has been progressively increased with time from four (4) to six (6) to eight (8) and sometimes now to ten (10) to enhance the resolution of the shade of red.

The increased number of static RAM cells at each memory position in the look-up table has caused the distributed capacitances in the look-up table to increase, thereby producing a reduction in the frequency of response of the look-up table. Furthermore, the increased number of cells in the look-up table and the increase in the distributed capacitance in the look-up table have produced significant increases in power loss in the look-up table and in the pre-amplifiers and amplifiers following the look-up table. This increased power loss has become particularly aggravated because the space occupied on a chip by the look-up table has progressively decreased with decreases in the thickness of the electrical leads in the electrical circuitry on the chip.

Figure 1A:
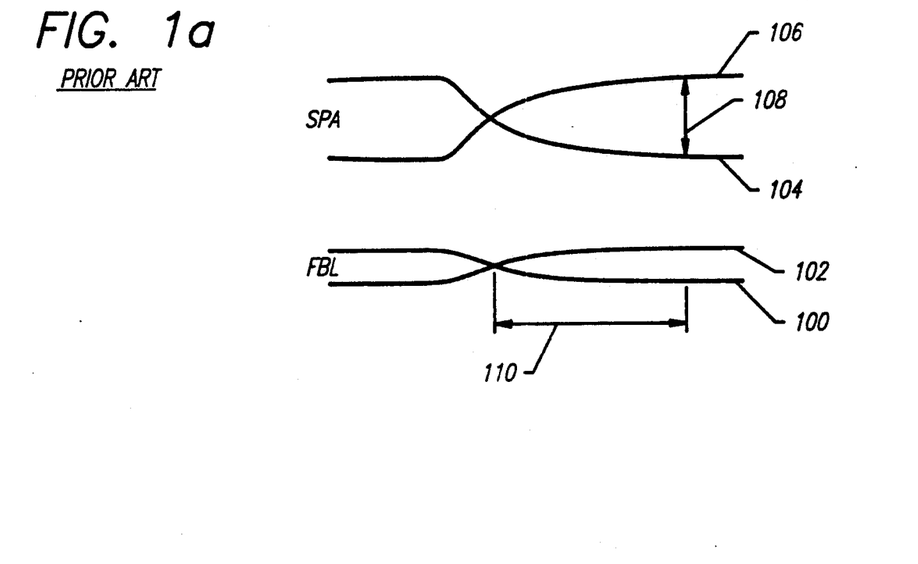
FIG. 1a shows voltage waveforms at strategic terminals in the pre-amplifier stage shown in FIG. 1.

The limitation in the frequency of response of the static RAM cell 10 and the pre-amplifier in FIG. 1 may be seen from the waveforms in FIG. 1a. The voltages produced on the lines 18 and 20 are respectively indicated at 100 and 102 in FIG. 1a. As will be seen, a binary value of "1" is initially produced in the cell 10 as may be seen from a low voltage on the line 20 and a high voltage on the line 18. The voltages on the output lines 58 and 60 are respectively indicated at 104 and 106. A line 108 with arrows at its opposite ends indicates the time when the voltage difference between the lines 18 and 20 constitutes a threshold for triggering the operation of the following stage. As will be seen, a time difference 110 exists between the time of crossover between the voltages 100 and 102 on the lines 18 and 20 and the threshold voltage 108.

Figure 2:
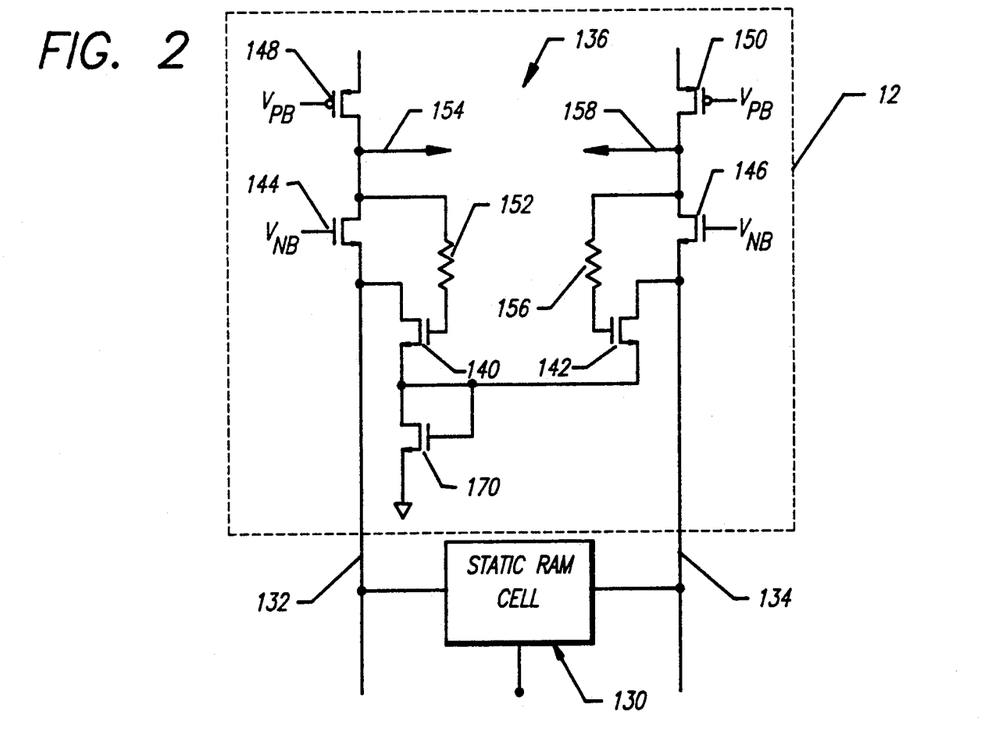
FIG. 2 is a circuit diagram of the static RAM cell of FIG. 1 in block form and an improved pre-amplifier stage for enhancing frequency response and reducing power consumption in comparison to the pre-amplifier stage in the embodiment shown in FIG. 1.

FIG. 2 illustrates an embodiment of the invention for increasing the speed of response of the pre-amplifier shown in FIG. 1 and decreasing the power losses in such pre-amplifier. In the embodiment shown in FIG. 2, a static RAM cell generally indicated at 130 is shown in block form. Although the static RAM cell 130 is preferably the same as the cell 10 in FIG. 1, the cell 130 may constitute any static RAM cell which is differentially connected and which is provided with lines 132 and 134 respectively corresponding to the lines 18 and 20 in FIG. 1.

A pre-amplifier generally indicated at 136 in FIG. 2 is associated with the cell 130. The pre-amplifier 136 is generally the same as the pre-amplifier 12 in FIG. 1. Because of this, transistors 140, 142, 144, 146, 148 and 150 in FIG. 2 respectively correspond to transistors 50, 52, 54, 56, 62 and 64 in FIG. 1. However, a negative feedback is provided by an impedance, preferably a resistor 152, between an output line 154 and the gate of the transistor 140. Similarly, a negative feedback is provided between an impedance, preferably a resistor 156, between an output line 158 and the gate of the transistor 142. The output lines 154 and 158 respectively correspond to the output lines 58 and 60 in FIG. 1. The gate and source of a transistor 170 are connected to the drains of the transistors 140 and 142. The transistor 170 may be an n- type of transistor. The drain of the transistor 170 receives the reference potential such as ground.

When current flows through the line 134 in representation of a binary "1", the resultant low voltage on the drain of the transistor 146 causes current to flow through the transistors 146 and 150 to produce a low voltage on the output line 158 because of the high transconductance of the transistor 146. This low voltage is introduced through the resistance 156 to the gate of the transistor 142, thereby reducing the current through the transistor 142 and the transconductance of the transistor 142. The reduction of the current in the transistor 142 is facilitated by the bias applied by the transistor 170 to the drains of the transistors 140 and 142. As a practical matter, the current through the transistor 142 is reduced to a value such as one sixth (1/6) of the current passing through the cell 130 and the bit line 134.

If the current through the cell 10 and the bit line 20 in FIG. 1 is considered as a unitary value of one (1), the currents through each of the transistors 28 and 30 in FIG. 1 is set to a value of one half (½). The current in the cell 10 and the pre-amplifier 12 in FIG. 1 may accordingly be considered to be a cumulative value of two (2). However, in the embodiment shown in FIG. 2, the current in the cell 130 and the pre-amplifier 136 for a binary value of "1" in the cell has a cumulative value of one (1) in the bit line 134, one half (½) in the transistor 140 and one sixth (1/6) in the transistor 142. This represents a reduction of approximately twenty percent (20%) in the power consumption in the embodiment of FIG. 2 compared to the power consumption in the embodiment shown in FIG. 1 when the cumulative value of the currents in the cell 130 and the pre-amplifier 136 is considered as a base value.

In addition to reducing the power consumption in the pre-amplifier 136, the negative bias applied to the gate of the transistor 142 also produces an increase in the frequency response of the pre-amplifier. For example, when the cell 130 is in a binary "1" state, the bias current through the transistor 140 is approximately three (3) times greater than the bias current through the transistor 142. This causes the transconductance of the transistor 140 to be considerably greater than the transconductance of the transistor 142. The increased transconductance of the transistor 140 relative to that of the transistor 142 causes the line 132 to respond faster to the reading of a binary "0" from the cell 130.

It will be appreciated that the resistances 152 and 156 provide delays in the feedback voltages respectively introduced to the gates of the transistors 140 and 142 when the signal in the cell 130 changes between a binary "1" and a binary "0". For example, when the signal in the cell 130 changes from a binary "1" to a binary "0", the current through the transistor 140 changes from a magnitude of one half (½) of the current through the cell 130 to a magnitude of one sixth (1/6) of the current in the cell. However, this change is delayed slightly by the resistance 152. This delay prolongs the relatively high transconductance in the transistor 144 and thus shortens the time until the threshold voltage is produced between the output lines 132 and 134 to trigger the operation of the next stage.

The delay provided by the resistance 156 also helps to shorten the time of response of the pre-amplifier 136 when the signal in the cell 130 is changing from a binary value of "1" to a binary value of "0". This delay causes the low bias current through the transistors 142 and 146 to continue for a short time after the current starts to flow through the cell 130 and the line 132 to represent a binary "0". Because of this low bias current, the high transconductance in the transistors 144 and 140 can predominate until the threshold voltage difference is produced in the lines 154 and 158 to trigger the stage following the pre-amplifier stage 136.

Figure 2A:
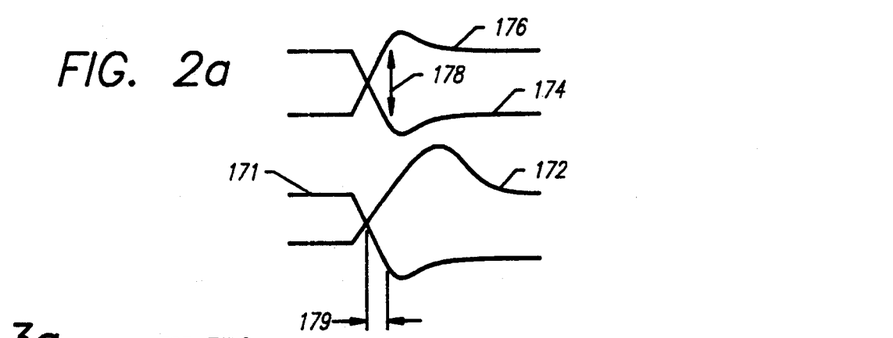

The shortened time of response in the pre-amplifier stage 136 is illustrated in FIG. 2a. As will be seen, the voltages on the lines 132 and 134 are respectively illustrated at 171 and 172. These curves illustrate that the value in the cell changes from a "1" to a "0", as illustrated by the change from a high voltage to a low voltage on the line 132 and from a low voltage to a high voltage on the line 134. The voltages on the output lines 154 and 158 are respectively illustrated at 174 and 176 in FIG. 2a. The threshold voltage between the lines 154 and 158 is illustrated at 178 in FIG. 2a. As will be seen, the time 179 for the crossover between the voltages 171 and 172 and the production of the threshold voltage 178 is considerably reduced relative to that shown in FIG. 1. This indicates that the frequency of response of the pre-amplifier shown in FIG. 2 is higher than that shown in FIG. 1.

Figure 3:
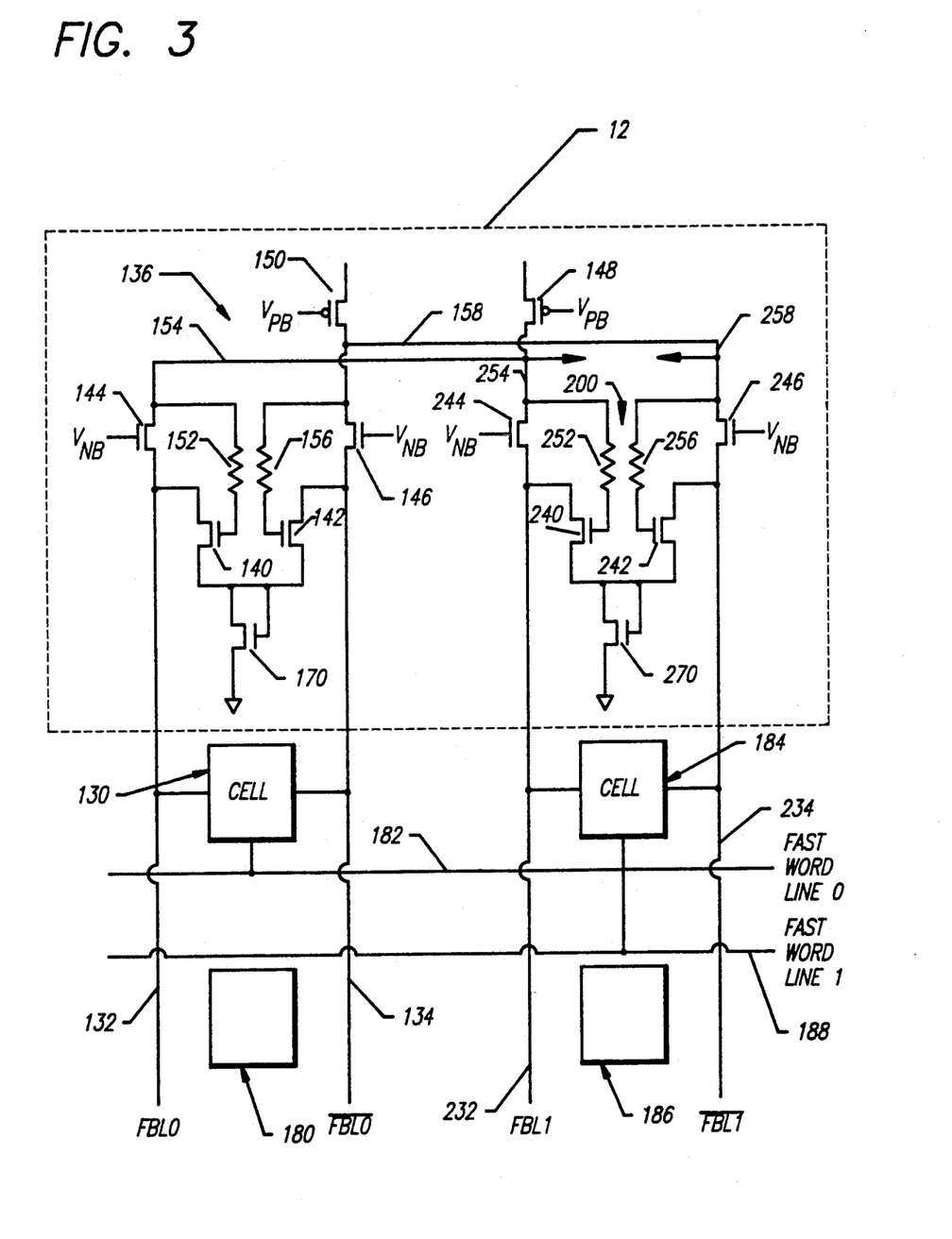
FIG. 3 is a circuit diagram of a pair of static RAM cells of FIG. 2 in block form and a pair of the improved pre-amplifiers of FIG. 2 with the pre-amplifiers connected for further enhancing frequency response and further reducing power consumption in comparison to the embodiments shown in FIGS. 1 and 2.

FIG. 3 illustrates an additional embodiment of the invention. In the embodiment shown in FIG. 3, an arrangement of the cell 130 and the pre-amplifier 136 is shown similar to that shown in FIG. 2. The pre-amplifier 136 includes the transistors 140, 142, 144, 146, 148 and 150 and the resistances 152 and 156 as in FIG. 2. The embodiment shown in FIG. 3 also includes a cell, generally indicated at 180, which is connected to the same bit lines 132 and 134 as the cell 136 but which is controlled by a different word line than the cell 136. The cell 130 is shown as being connected to a fast word line 0 through a line 182 and to fast bit lines 0 through the lines 132 and 134. The cell 180 is connected to the fast bit lines 132 and 134 and to a word line (not shown) different than the fast word line 0.

Two additional cells, generally indicated at 184 and 186, are included in the embodiment shown in FIG. 3. The cell 184 is connected to a word line 188 corresponding to a word line 1 and is also connected to lines 232 and 234 providing complementary binary bit line signals for bit lines 1. The cell 186 is also connected to the lines 232 and 234 but is responsive to a different word line (not shown) than the word line 186.

A pre-amplifier generally indicated at 200 is associated with the cell 184 in a manner similar to the association of the pre-amplifier 136 with the cell 130. To simplify the subsequent discussion, the components in the pre-amplifier 200 are given the same numerical designations as the components in the pre-amplifier 136 except that they are preceded by the prefix "2" rather than the prefix "1" as in the embodiment shown in FIG. 2. For example, the transistors 140 and 142 in FIG. 2 and in the pre-amplifier 136 at the left side of FIG. 3 are designated at 240 and 242 in the pre-amplifier 200 at the right side of FIG. 3.

In the embodiment shown in FIG. 3, the output lines 154 and 158 from the pre-amplifier 136 are respectively connected to the output lines 254 and 258 from the pre-amplifier 200. Furthermore, the transistors 148 and 150 are shown as being connected to the output lines 154 and 158 as in the embodiment shown in FIG. 2. However, since the output lines 154 and 254 are common, there is no transistor connected to the line 254 corresponding to the connection of the line 154 to the transistor 148. Similarly, since the output lines 158 and 258 are common, there is no transistor connected to the line 254 corresponding to the connection of the line 258 to the transistor 150. Hereafter the output lines 154 and 254 will be designated as the line 154 and the output lines 158 and 258 will be designated as the line 158.

As will be appreciated, the elimination of two (2) transistors corresponding to the transistors 148 and 150 simplifies the circuitry and reduces power losses in the pre-amplifier 200. Furthermore, although pairs of pre-amplifiers such as the pre-amplifiers 136 and 200 are coupled to each other in FIG. 3, it will be appreciated that more pre-amplifiers than pairs may be coupled to one another in a similar fashion without departing from the scope of the invention.

In FIG. 3, the cells 130 and 180 and all of the other cells in this column have the bit lines 132 and 134 to indicate a fast bit line 0 ("FBLO" and "$\overline{FBLO}$"). In the previous discussion relating to the pre-amplifier 136 in FIG. 2, one side of the pre-amplifier has been assumed to amplify an output current (a value of 1) and to provide a relatively low bias current (a current of 1/6) and the other side of the pre-amplifier has been assumed to provide a relatively high bias current (a current of ½). FIG. 3 provides a relationship where the bias currents in a first pre-amplifier (e.g. 136) enhance the frequency response to signals read from a cell (e.g. 184) associated with a second pre-amplifier (e.g. 200) to which the first pre-amplifier (e.g. 136) is coupled. Three different examples are respectively provided in FIGS. 3a, 3b and 3c of operative relationships in which the frequency response of the pre-amplifiers is enhanced.

Figure 3A:
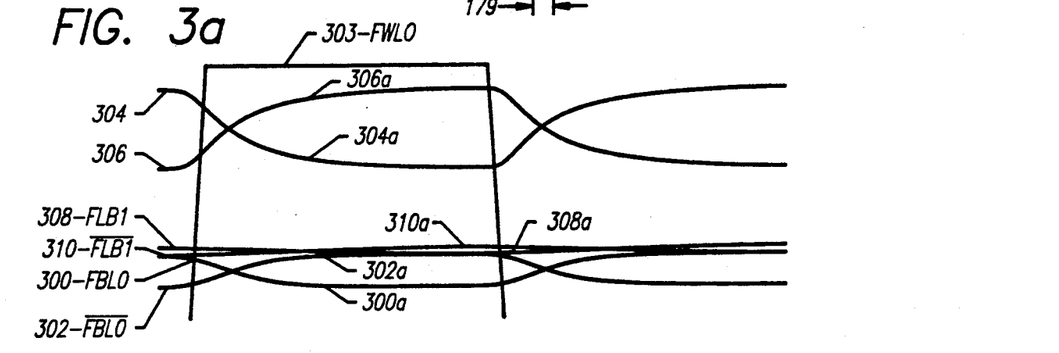
FIGS. 3a, 3b and 3c show voltage waveforms similar to those shown in FIG. 2a at strategic terminals in the circuitry shown in FIG. 3 when such circuitry operates under sets of different conditions.

FIG. 3a shows a relationship in which the bit lines 132 and 134 (FBLO and $\overline{FBLO}$) initially provide a "1" output. This is respectively indicated at 300 (and also FBLO) for the line 132 and at 302 (and also $\overline{FBLO}$) for the line 134. In this state of operation, most of the bias current in the pre-amplifier 136 passes through the transistors 144, 140 and 170. This maintains a high conductance in the transistor 144 even though no current is passing through the line 132 from the cell 130, the cell 182 or any other cell connected to the line 132 (FBLO).

Assume now that the cell 130 is triggered to read a binary "0". This occurs when the voltage on the word line 182 (FWLO) rises as indicated at 303 in FIG. 3a. This causes current to flow through the cell 130 and the line 132 to produce a low voltage on the line 132. This low voltage is indicated at 300a in FIG. 3a. At the same time, the absence of any current through the cell 130 to the line 134 causes the voltage on the line 134 to rise as indicated at 302a in FIG. 3a.

The voltage produced on the line 154 in FIG. 3 is indicated at 304 and the voltage produced on the line 158 is indicated at 306 in FIG. 3a. As will be seen, the voltage 304 is initially high because no current is flowing through the line 132 from the cell 130. When a current flows through the line 132 to indicate a binary "0", the voltage on the line 154 decreases as indicated at 304a in FIG. 3a. At the same time, the voltage on the line 158 rises because no current flows through the line 134 from the cell 130 when a binary "0" is being read by the cell 130. The rise in voltage on the line 158 is indicated at 306a in FIG. 3a.

It will be appreciated that the threshold voltage for triggering the stages following the pre-amplifier 136 is produced on an expedited basis in the example of FIG. 3a in the same manner as shown at 178 and 179 in FIG. 2a. The coupling of the pre-amplifiers 136 and 200 certainly does not detract from this expediting relationship in the example in FIG. 3a. If anything, this coupling enhances the expediting relationship.

In FIG. 3a, the voltage on the line 232 is indicated at 308 and the voltage on the line 234 is indicated at 310. As will be seen, the voltage 308 on the line 232 is initially slightly higher than the voltage 310 on the line 234. This results from the fact that the voltage on the output line 154 is initially higher than the voltage on the output line 158. However, when the voltage on the line 154 decreases because of a flow of current from the cell 130 through the line 132 to represent a binary "0", the decrease in the voltage on the line 154 causes the voltage on the line 232 to decrease slightly. This is indicated at 308a in FIG. 3a. At the same time, the voltage on the line 234 increases as indicated at 310a in FIG. 3a.

As will be seen, very little change occurs in the voltages on the lines 232 and 234 when the cell 130 is triggered to a binary indication of "0". This means that very little power is consumed in the pre-amplifier 200 when the binary signal in the cell 130 changes from a binary value of "1" to a binary value of "0". This constitutes one of the advantages of coupling the output lines in the pre-amplifiers 136 and 200.

Figure 3B:
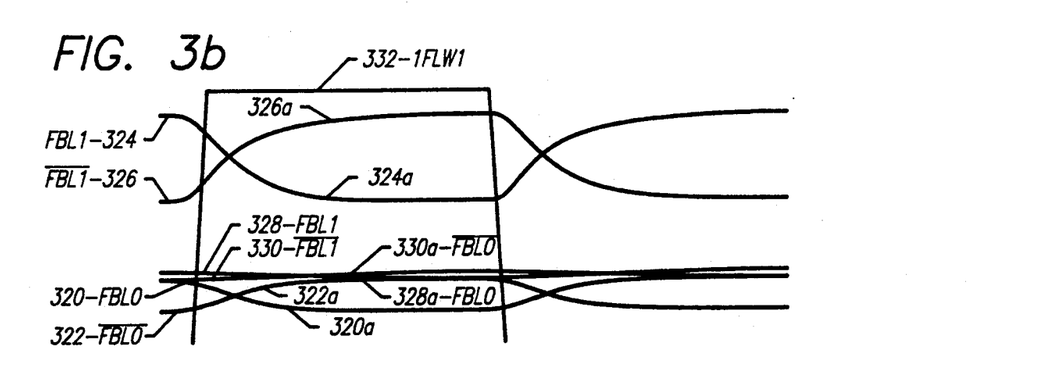

FIG. 3b indicates another operative relationship between the pre-amplifiers 136 and 200. In this operative relationship, the cell 130 is initially providing a "1" indication. This causes current to flow from the cell 130 through the line 134 ($\overline{FBLO}$) and a low voltage to be produced on this line. At the same time, a high voltage is produced on the line 132 (FBLO). The voltage on the line 132 is indicated at 320 (or FBLO) and the voltage on the line 134 is indicated at 322 (or $\overline{FBLO}$).

During the time that the cell 130 is producing current in the line 134 to indicate a binary "1", the voltage on the output line 158 is low as indicated at 326 in FIG. 3b and the voltage on the output line 154 is high (indicated at 324 in FIG. 3b). The voltage on the line 232 is indicated at 328 and the voltage on the line 234 is indicated at 330. As will be seen, both voltages are relatively high because no output is provided from any of the cells, such as the cells 184 and 186, connected to the word line 188 (FWL1).

Assume now that a "0" is produced in the cell 184 when the word line 188 is energized by a signal 332 on the word line 188 (FWL1). Under such circumstances, the current from the cell 184 through the bit line 232 causes a low voltage to be produced on the line 232 as indicated at 328a and also at FBL1 in FIG. 3b. At the same time, the voltage 330 on the line 234 slightly increases as indicated at 330a and also at $\overline{FBL1}$ in FIG. 3b. Since there is only a slight change in the voltage on the line 234, there is not much change in the current through the transistors 242 and 246 in FIG. 3. As a result, the frequency of the response of the pre-amplifier 200 is expedited.

The decrease in the voltage 328a on the line 232 produces a decrease in the voltage 324 on the output line 154, as indicated at 324a in FIG. 3b. At the same time, the voltage 326 on the output line 234 increases because current no longer flows through the line 134 to indicate a binary "1" in the cell 130. The resultant increase in the voltage on the line 134 (as indicated at 322a in FIG. 3b) causes the voltage 326 on the output line 158 to increase. This is indicated at 326a in FIG. 3b.

Figure 3C:
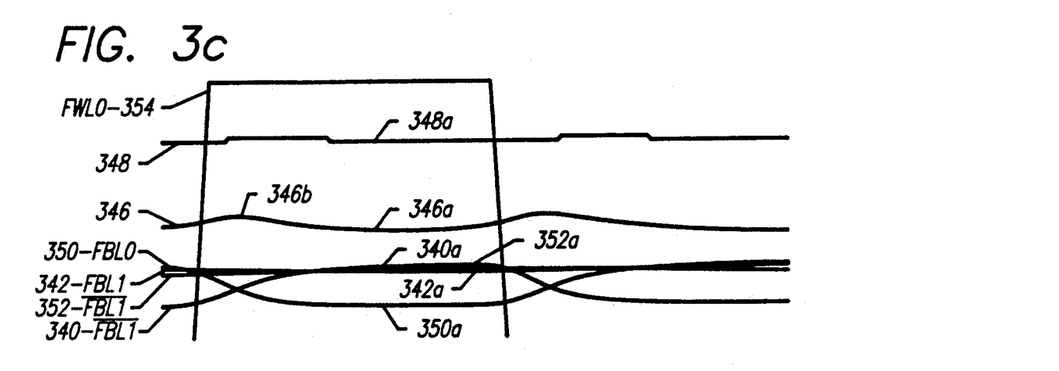

FIG. 3c illustrates the operation of the circuitry shown in FIG. 3 when there is a change from a "0" in the cell 184 to a "0" in the cell 130. Since the cell 184 is initially providing a "0" output, current flows from the cell through the bit line 232 and produces a low voltage on the line 232. The voltage on the line 232 is indicated at 340 and also at FBL1 in FIG. 3c. Since a low voltage is initially produced on the line 232, a high voltage is produced on the line 234 ($\overline{FBL1}$). The voltage on the line 234 is indicated at 342 and also at $\overline{FBL1}$ in FIG. 3c.

The low voltage on the line 232 causes a low voltage to be produced on the output line 154 in FIG. 3. The voltage on the output line 154 is indicated at 346 in FIG. 3b and the voltage on the output line 158 is indicated at 348 in FIG. 3c. Since the voltage 346 on the output line 154 is initially low, the voltage 348 on the output line 158 is initially high. The voltages 350 and 352 respectively on the lines 132 and 134 are both initially high since no current flows from the cell 130, the cell 182 or any of the cells to the bit line 132 (FBLO) or the bit line 134 ($\overline{FBLO}$).

When the word line 182 (FWLO) is energized as indicated at 354 in FIG. 3 and the cell 130 is energized to read a binary "0", current flows from the cell through the bit line 132 to produce a low voltage on the bit line, as indicated at 350a in FIG. 3c. The voltage 352 on the line 134 ($\overline{FBLO}$) continues to remain high (indicated at 352a in FIG. 3c) although there is a slight overshoot in the voltage. Since the voltage on the line 134 changes only relatively slightly when the cell 130 starts to indicate a binary "0", this tends to expedite the frequency response in the cell 130 and the pre-amplifier 136 from a change of a binary "0" in the cell 184 to a binary "0" in the cell 130.

The low voltage 350a produced on the line 132 for a binary "0" in the cell 130 causes a low voltage to continue to be produced on the line 154, as indicated at 346a in FIG. 3c. At the same time, the high voltage 348 continues to be produced on the output line 158, as indicated at 348a in FIG. 3c. The continued relatively high voltage 348a on the output line 158 and the continued lack of a current flow through the line 134 ($\overline{FBLO}$) cause the voltage on the line 134 to remain relatively high. This is indicated at 342a in FIG. 3c. Since there is relatively little change in the voltage 342 on the line 134 ($\overline{FBLO}$), this also expedites the frequency response of the cell 130 and the preamplifier 136 to the production of a "0" output from the cell.

As will be seen, there is a slight bump 346b in the output voltage on the output line 154 when there is a change from a "0" reading in the cell 184 to a "0" reading in the cell 130. This results from the slight overshoot which occurs in the voltage on one of the lines 132 and 232 when there is a change between a "0" in the cell 184 and a "0" in the cell 130. This voltage bump has no effect on the operation of the pre-amplifiers 136 and 200 or on the stages following these pre-amplifiers since there is a substantial difference between the voltages on the output lines 154 (the voltage 346 in FIG. 3c) and 158 (the voltage 348 in FIG. 3c) even with this voltage bump.

The embodiment shown in FIG. 3 has certain important advantages. By using only a single pair of transistors 148 and 150 for each pair of interconnected pre-amplifiers such as the pre-amplifiers 136 and 200, power losses in the pre-amplifiers are reduced. Furthermore, the frequency of response is enhanced in the pre-amplifiers by eliminating stages in the pre-amplifiers. The frequency of response of each interconnected pre-amplifier is also enhanced by pre-charging distributed capacitances in the lines from the other one of the interrelated pre-amplifiers in the pair. This is particularly true since only one of the pre-amplifiers in a pair is passing an output current at any instant and the pre-amplifiers in the pair are unrelated in their word lines and their bit lines.

One of the pre-amplifiers in a pair is generally biased by the other pre-amplifier so that one of its bit lines is at a voltage which does not change very much when the cell associated with such pre-amplifier is triggered to provide an output from the cell. This enhances the frequency response of the triggered pre-amplifier. Furthermore, the other pre-amplifier is also biased so that there is hardly any change in one of the bit lines when current through the cell associated with such pre-amplifier is discontinued. This also tends to enhance the frequency response of the system including such pre-amplifier and limit power losses in such system.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination,
    a cell having first and second input lines and providing for a passage of current through the cell and the first input line to represent a first binary value in the cell and for a passage of current through the cell and the second input line to represent a second binary value in the cell, and
    a pre-amplifier including first and second transistors respectively connected to the first and second input lines and respectively including first and second output lines to provide a first voltage on the first output line in representation of the first binary value and to provide the first voltage on the second output line in representation of the second binary value,
    the pre-amplifier including third and fourth transistors respectively having a plurality of terminals and respectively connected at first terminals in the plurality to the first and second input lines and having a common connection at second terminals in the plurality for providing a common mode rejection of the currents on the first and second input lines and for providing transconductances to expedite the frequency of response of the first and second transistors to changes in the binary representation in the cell, and the pre-amplifier including means for unbalancing the transconductances of the third and fourth transistors in accordance with the provision of the first voltage on respective ones of the first and second output lines to expedite the frequency of response of the first and second transistors to changes in the binary representation in the cell.

2. In a combination as set forth in claim 1, the unbalancing means including negative feedbacks respectively from the first and second output lines to the third and fourth transistors to unbalance the transconductances of the third and fourth transistors.

3. In a combination as set forth in claim 1, the third and fourth transistors being unbalanced to provide for a greater transconductance in a particular one of the third and fourth transistors than in the other one of the third and fourth transistors, the particular one of the third and fourth transistors being operatively coupled to the individual one of the first and second output lines where the first voltage is produced.

4. In a combination as set forth in claim 3, means for feeding a voltage back to the third and fourth transistors respectively from the first and second output lines to provide a negative feedback to the third and fourth transistors.

5. In combination, a cell having first and second lines and providing for a passage of current through the cell and the first line to represent a first binary value in the cell and for a passage of current through the cell and the second line to represent a second binary value in the cell, and a pre-amplifier including first and second transistors respectively connected to the first and second lines and respectively including first and second output lines to provide a first voltage on the first output line in representation of the first binary value and to provide the first voltage on the second output line in representation of the second binary value, the pre-amplifier including third and fourth transistors for providing transconductances to expedite the frequency of response of the first and second transistors to changes in the binary representation in the cell, and the pre-amplifier including means for unbalancing the transconductances of the third and fourth transistors in accordance with the provision of the first voltage on respective ones of the first and second output lines to expedite the frequency of response of the first and second transistors to changes in the binary representation in the cell, the cell constituting a first cell, the pre-amplifier constituting a first pre-amplifier, a second cell corresponding to the first cell and having third and fourth lines respectively corresponding to the first and second lines and having third and fourth output lines respectively corresponding to the first and second output lines, the first cell being responsive to a first word and a first bit to provide for the passage of current through the first cell and the first line to represent the first binary value in the cell and for the passage of current through the second cell and the second line to represent the second binary value, the second cell being responsive to a second word and a second bit to provide for the passage of current through the second cell and the third line to represent the first binary value and for the passage of current through the second cell and the fourth line to represent the second binary value, a second pre-amplifier corresponding to the first pre-amplifier and including fifth and sixth transistors respectively corresponding to the first and second transistors and including seventh and eighth transistors respectively corresponding to the third and fourth transistors, the unbalancing means in the first pre-amplifier including first unbalancing means, second unbalancing means in the second pre-amplifier corresponding to the first unbalancing means in the first pre-amplifier, and means for respectively interconnecting the first and third output lines and the second and fourth output lines to enhance the frequency of response of the first and second transistors to changes in the binary representation in the first cell and to enhance the frequency of response of the fifth and sixth transistors to changes in the binary representation in the second cell.

6. In combination, a cell having first and second lines for reading information differentially to provide an output at any one time only on one of the first and second lines, first and second means respectively connected to the first and second lines for preparing the first and second lines to provide an output at any time from an individual one of the lines and to amplify the output from such line, and third and fourth means for respectively unbalancing the preparedness provided by the first and second means to expedite the time at which the output is provided at such time from the individual one of the first and second lines in accordance with the information being read differentially from the cell at such time, the third and fourth means respectively having a plurality of terminals and being respectively connected at first terminals in the plurality to the first and second lines and having a common connection at second terminals in the plurality for providing a common mode rejection of the information read differentially on the first and second lines.

7. In a combination as set forth in claim 6, the third and fourth means providing a greater preparedness through the particular one of the first and second lines not receiving the output from the cell at that time than through the other one of the lines.

8. In a combination as set forth in claim 7, the first and second means respectively providing equal preparedness in the first and second lines and the first and second means respectively including fifth and sixth means respectively for unbalancing the third and fourth means to provide the greater preparedness through the particular one of the first and second lines not receiving the output from the cell than through the other one of the lines.

9. In a combination as set forth in claim 8, the third and fourth means respectively including first and second transistors respectively connected to the first and second lines and to each other to provide balanced transconductances in the first and second lines, and the fifth and sixth means respectively including first and second impedances for providing negative feedbacks to the first and second transistors to unbalance the transconductances of the first and second transistors for a greater preparedness through the particular one of the first and second lines not receiving the output from the cell than through the other one of the lines.

10. In a combination as set forth in claim 8, p1 the third and fourth means respectively including first and second transistors respectively connected in the first and second means to unbalance the preparedness provided by the first and second means, a third transistor connected in a first circuit branch with the first line and the first transistor and in a second circuit branch with the second line and the second transistor to facilitate the unbalance in the preparedness provided by the first and second transistors.

11. In combination, a cell having first and second lines for reading information differentially to provide an output at any one time only on one of the first and second lines, first means connected to the first and second lines for preparing the first and second lines to provide an output at any time from an individual one of the lines and to amplify the output from such line, and second means included in the first means for unbalancing the preparedness provided by the first means to expedite the time at which the output is provided at such time from the individual one of the lines in accordance with the information being read differentially from the cell at such time, the cell constituting a first cell and being responsive to a first word and a first bit for reading information differentially from the cell, a second cell corresponding to the first cell and responsive to a second word and a second bit for reading information differentially from the second cell, third and fourth means respectively corresponding for the second cell to the first and second means for the first cell, and fifth means coupling the first and third means for affecting the unbalance in the preparedness provided by each of the second and fourth means to the respective one of the first and third means in accordance with the unbalance provided by the other one of the second and fourth means.

12. In combination, a cell having first and second lines and constructed to provide a differential output on the first and second lines and to provide a current through the first line for a representation of a first binary value and through the second line for a representation of a second binary value, first and second transistors each having a plurality of terminals and respectively connected at first terminals in the plurality to respective ones of the first and second lines and having a common connection at respective ones of second terminals different from the first terminals for providing a transconductance in the transistors and for providing a common mode rejection of the differential output on the first and second lines, first and second means operatively coupled respectively to the first and second lines for respectively providing outputs in accordance with the current through the cell and the individual one of the first and second lines, and third and fourth means operatively coupled respectively to third terminals of the first and second transistors and to the first and second means for reducing the transconductance at each instant of a particular one of the first and second transistors in accordance with the current from the cell through the individual one of the first and second lines and the particular one of the first and second transistors receiving the reduced transconductance at each instant being the transistor coupled to the line receiving the current from the cell.

13. In a combination as set forth in claim 12, third and fourth transistors respectively coupled to the first and second transistors and to the first and second lines to reduce the transconductance at each instant of the particular one of the first and second transistors in accordance with the flow of current from the cell through the individual one of the first and second lines at that instant.

14. In a combination as set forth in claim 13, the first and third transistors being connected in a first circuit to provide the transconductance in the first transistor, the second and fourth transistors being connected in a second circuit to provide the transconductance in the second transistor, means for providing a feedback from the output of the third transistor to the first transistor, means for providing a feedback from the output of the fourth transistor to the second transistor, the feedbacks to the first and second transistors reducing the transconductance at each instant of the particular one of the first and second transistors in accordance with the flow of current from the cell through the individual one of the first and second lines.

15. In a combination as set forth in claim 14, the means providing the feedback to the first transistor constituting a negative feedback, the means providing the feedback to the second transistor constituting a negative feedback.

16. In a combination as set forth in claim 12, means operatively coupled to the first and second transistors to enhance the reduction in the transconductance at each instant of the individual one of the first and second transistors.

17. In combination, a cell having first and second lines and constructed to provide a differential output on the first and second lines and to provide a current through the first line for a representation of a first binary value and through the second line for a representation of a second binary value different from the first binary value, first and second transistors respectively connected to the first and second lines for providing a transconductance in the transistors, first means operatively coupled to the first and second lines for respectively providing outputs in accordance with the current through the cell and the individual one of the first and second lines, and second means operatively coupled to the first and second transistors and the first means for reducing the transconductance at each instant of a particular one of the first and second transistors in accordance with the current from the cell through the individual one of the first and second lines and the particular one of the first and second transistors receiving the reduced transconductance at each instant being the transistor coupled to the line receiving the current from the cell, the cell constituting a first cell, a second cell corresponding to the first cell and having third and fourth lines respectively corresponding to the first and second lines, the first cell providing a differential output for a first bit in a first word, the second cell providing a differential output for a second bit in a second word, third and fourth transistors respectively corresponding in the second cell to the first and second transistors in the first cell, third and fourth means respectively having the same association with the second cell as the association of the first and second means with the first cell, and fifth means respectively coupling the outputs of the first and third transistors and the second and fourth transistors to enhance the frequencies at which the outputs are obtained from the transistors.

18. In combination, a cell having first and second lines and differentially connected to provide a current through the cell and the first line in representation of a first binary value and a current through the cell and the second line in representation of a second binary value, first and second means respectively having a plurality of terminals and operably coupled respectively at first terminals in the plurality to the first and second lines to provide substantially equal transconductances through the first and second lines, the first and second means having a common connection at second terminals in the plurality and providing a common mode rejection of the currents through the first and second lines, and third and fourth means operably coupled respectively to third terminals in the first and second means and to the first and second lines to decrease the transconductance at each instant in a particular one of the first and second means, the particular one of the first and second means being operably coupled to the line through which the current is flowing from the cell at that instant.

19. In a combination as set forth in claim 18, first and second output lines respectively coupled to the third and fourth means to provide an output in an individual one of the output lines in accordance with the flow of current through the cell and the individual one of the first and second lines, and the third and fourth means being respectively coupled to the first output line and the first means and to the second output line and the second means to decrease the transconductance at each instant in the individual one of the output lines providing the output of that instant.

20. In a combination as set forth in claim 19, the first and second means being constructed to decrease the time until the flow of current through the cell and the individual one of the first and second lines and the production of the output at the individual one of the first and second output lines.

21. In a combination as set forth in claim 20, the third and fourth means being constructed to delay the response of the third and fourth means in decreasing the transconductance at each instant in the line through which the current is flowing from the cell at that instant so as to further decrease the time for the flow of current through the cell and the individual one of the first and second lines and the production of the output at the individual one of the first and second output lines.

22. In a combination as set forth in claim 18, fifth means operatively coupled to the first and second means for enhancing the decrease in the transconductance of the particular one of the first and second means.

23. In combination, a cell having first and second lines and differentially connected to provide a current through the cell and the first line in representation of the first binary value and a current through the cell and the second line in representation of a second binary value, first and second means operably coupled respectively to the first and second lines to provide substantially equal transconductances through the first and second lines, the first and second means having a common connection, and third and fourth means operably coupled respectively to the first and second means and to the first and second lines to decrease the transconductance at each instant in a particular one of the first and second means, the particular one of the first and second means being operably coupled to the line through which the current is flowing from the cell at that instant, first and second output lines respectively coupled to the first and second means to provide an output in an individual one of the output lines in accordance with the flow of current through the cell and the individual one of the first and second lines, and the third and fourth means being respectively coupled to the first output line and the first means and to the second output line and the second means to decrease the transconductance at each instant in the individual one of the output lines providing the output of that instant, the cell constituting a first cell, a second cell corresponding to the first cell and having third and fourth lines respectively corresponding to the first and second lines in the first cell, fifth and sixth means respectively corresponding for the second cell to the first and second means for the first cell, seventh and eighth means respectively corresponding for the second cell to the third and fourth means for the first cell, third and fourth output lines respectively corresponding for the second cell to the first and second output lines for the first cell, and fifth means respectively coupling the first and third output lines and the second and fourth output lines to further decrease the time for the flow of current through one of the cells and an associated one of the lines and the production of an output at an associated one of the output lines.

24. In combination, a cell having first and second lines and being differentially connected to produce a current through the first line in representation of a first binary value and through the second line in representation of a second binary value, a first transistor connected to the first line to provide a current through the first transistor in accordance with the flow of current through the first line, a second transistor connected to the second line to provide a current through the second transistor in accordance with the flow of current through the second line, a first output line connected to the first transistor to provide an output in accordance with the flow of current through the first transistor, a second output line connected to the second transistor to provide an output in accordance with the flow of current through the second transistor, first means having a first plurality of terminals and connected at first individual ones of the terminals in the first plurality to the first output line and to the first input line to provide a reduced transconductance to the first transistor relative to the transconductance to the second transistor with an output on the first output line, and second means having a second plurality of terminals and connected at first individual ones of the terminals in the second plurality to the second output line and to the second input line to provide a reduced transconductance to the second transistor relative to the transconductance to the first transistor with an output on the second output line, the first and second means having a common connection at second individual ones of the terminals in the first and second pluralities to provide a common mode rejection of the currents through the first and second lines.

25. In a combination as set forth in claim 24, the first means including a third transistor connected to the first transistor to provide the reduced transconductance to the first transistor, in accordance with the output in the first output line, relative to the transconductance provided to the second transistor, the second means including a fourth transistor connected to the second transistor to provide the reduced transconductance to the second transistor, in accordance with the output in the second output line, relative to the transconductance provided to the first transistor.

26. In a combination as set forth in claim 24, the first means including a negative feedback from the first output line to the first transistor to reduce the transconductance in the first transistor, in accordance with the output in the first output line, relative to the transconductance provided to the second transistor, the second means including a negative feedback from the second output line to the second transistor to reduce the transconductance to the second transistor, in accordance with the output in the second output line, relative to the transconductance provided to the first transistor.

27. In a combination as set forth in claim 26, the negative feedback from the first output line to the first transistor providing a delay in such feedback, the negative feedback from the second output line to the second transistor providing a delay in such feedback.

28. In a combination as set forth in claim 26, the negative feedback from the first output line to the first transistor including a first impedance, the negative feedback from the second output line to the second transistor including a second impedance.

29. In combination, a cell having first and second lines and being differentially connected to produce a current through the first line in representation of a first binary value and through the second line in representation of a second binary value, a first transistor connected to the first line to provide a current through the first transistor in accordance with the flow of current through the first line, a second transistor connected to the second line to provide a current through the second transistor in accordance with the flow of current through the second line, a first output line connected to the first transistor to provide an output in accordance with the flow of current through the first transistor, a second output line connected to the second transistor to provide an output in accordance with the flow of current through the second transistor, first means connected to the first output line to provide a reduced transconductance to the first transistor relative to the transconductance in the second transistor with an output on the first output line, and second means connected to the second output line to provide a reduced transconductance to the second transistor relative to the transconductance in the first transistor with an output on the second output line, the cell constituting a first cell, a second cell corresponding to the first cell and having third and fourth lines respectively corresponding to the first and second lines, third and fourth transistors respectively corresponding for the second cell to the first and second transistors for the first cell, third and fourth means respectively corresponding for the second cell to the first and second means for the first cell, third and fourth output lines respectively corresponding for the second cell to the first and second output lines for the first cell, and fifth means respectively coupling the first and third output lines and the second and fourth output lines to enhance the frequency of response in the output lines.

30. In combination, a cell having first and second lines and being differentially connected to produce a current through the first line in representation of a first binary value and through the second line in representation of a second binary value, a first transistor connected to the first line to provide a current through the first transistor in accordance with the flow of current through the first line, a second transistor connected to the second line to provide a current through the second transistor in accordance with the flow of current through the second line, a first output line connected to the first transistor to provide an output in accordance with the flow of current through the first transistor, a second output line connected to the second transistor to provide an output in accordance with the flow of current through the second transistor, first means connected to the first output line to provide a reduced transconductance to the first transistor relative to the transconductance to the second transistor with an output on the first output line, second means connected to the second output line to provide a reduced transconductance to the second transistor relative to the transconductance to the first transistor with an output on the second output line, the first means including a negative feedback from the first output line to the first means to reduce the transconductance in the first transistor, in accordance with the output in the first output line, relative to the transconductance provided to the second transistor, the second means including a negative feedback from the second output line to the second means to reduce the transconductance to the second transistor, in accordance with the output in the second output line, relative to the transconductance provided to the first transistor, the negative feedback from the first output line to the third transistor including a first impedance, the negative feedback from the second output line to the fourth transistor including a second impedance, the cell constituting a first cell, a second cell corresponding to the first cell and having third and fourth lines respectively corresponding to the first and second lines, third and fourth transistors respectively corresponding for the second cell to the first and second transistors for the first cell, third and fourth output lines respectively corresponding for the second cell to the first and second output lines for the first cell, third and fourth means respectively corresponding for the second cell to the first and second means for the first cell, third and fourth negative feedbacks respectively corresponding for the second cell to the first and second negative feedbacks for the first cell; and fifth means respectively coupling the first and third output lines and the second and fourth output lines to enhance the frequency of response in the output lines, a negative feedback from the third output line to the third transistor, such negative feedback including a third impedance, and a negative feedback from the fourth output line to the fourth transistor, such negative feedback including a fourth impedance.

31. In combination, a first cell having first and second lines and differentially connected to produce a current through the first line in representation of a first binary value and through the second line in representation of a second binary value, the first and second lines providing currents representative of a first binary bit and the first cell being responsive to a first word to produce the currents through the first and second lines, a second cell having third and fourth lines and differentially connected to produce a current through the third line in representation of the first binary value and through the fourth line in representation of the second binary value, the third and fourth lines providing currents representative of a second binary bit different from the first binary bit and the second cell being responsive to a second word different from the first word to produce the currents through the third and fourth lines, a first pre-amplifier operatively coupled to the first and second lines to amplify the currents in the first and second lines, a second pre-amplifier operatively coupled to the third and fourth lines to amplify the currents in the third and fourth lines, and means for interconnecting the first and second pre-amplifiers to facilitate the responses of the cells and the pre-amplifiers to the flow of current through the cells and the pre-amplifiers.

32. In a combination as set forth in claim 31, the first cell being constructed to store at each instant an individual one of the first binary value and the second binary value and to become energized in accordance with the production of a signal representing the first word to pass a current through the first line upon the storage of the first binary value in the cell and to pass a current through the second line upon the storage of the second binary value in the cell, the second cell being constructed to store an individual one of the first binary value and the second binary value and to become energized in accordance with the production of a signal representing the second word to pass a current through the third line upon the storage of the first binary value in the cell and to pass a current through the fourth line upon the storage of the second binary value in the cell, the first pre-amplifier including first and second stages, the first stage being constructed to produce an amplified signal in accordance with the current through the first line and the second stage being constructed to produce an amplified signal in accordance with the current through the second line, the second pre-amplifier including third and fourth stages, the third stage being constructed to produce an amplified signal in accordance with the current through the third line and the fourth stage being constructed to produce an amplified signal in accordance with the current through the fourth line, the interconnection means including first means for interconnecting the first and third stages and second means for interconnecting the second and fourth stages.

33. In a combination as set forth in claim 32, the first stage in the first pre-amplifier including third means for providing an output and fourth means for providing a controlled transconductance in the first line and including fifth means for providing a negative feedback from the third means to the fourth means, the second stage in the first pre-amplifier including sixth means for providing an output and seventh means for providing a controlled transconductance in the second line and including eighth means for providing a negative feedback from the sixth means to the seventh means, the third stage in the second pre-amplifier including ninth means for providing an output and tenth means for providing a controlled transconductance and including eleventh means for providing a negative feedback from the ninth means to the tenth means, and the fourth stage in the second pre-amplifier including twelfth means for providing an output and thirteenth means for providing a controlled transconductance and including fourteenth means for providing a negative feedback from the twelfth means to the thirteenth means.

34. In a combination as set forth in claim 33,
the interconnecting means including means for interconnecting the third and ninth means and means for interconnecting the sixth and twelfth means.

35. In combination,
a cell having first and second lines and providing for a passage of current through the cell and the first line to represent a first binary value in the cell and for a passage of current through the cell and the second line to represent a second binary value in the cell, and a pre-amplifier including first and second transistors respectively connected to the first and second lines and respectively including first and second output lines to provide a first voltage on the first output line in representation of the first binary value and to provide the first voltage on the second output line in representation of the second binary value, the pre-amplifier including third and fourth transistors for providing transconductances to expedite the frequency of response of the first and second transistors to changes in the binary representation in the cell, and the pre-amplifier including means for unbalancing the transconductances of the third and fourth transistors in accordance with the provision of the first voltage on respective ones of the first and second output lines to expedite the frequency of response of the first and second transistors to changes in the binary representation in the cell, a common reference, and a fifth transistor connecting the third and fourth transistors to the common reference.

36. In combination,
a cell having first and second lines and providing for a passage of current through the cell and the first line to represent a first binary value in the cell and for a passage of current through the cell and the second line to represent a second binary value in the cell, and a pre-amplifier including first and second transistors respectively connected to the first and second lines and respectively including first and second output lines to provide a first voltage on the first output line in representation of the first binary value and to provide the first voltage on the second output line in representation of the second binary value, the pre-amplifier including third and fourth transistors for providing transconductances to expedite the frequency of response of the first and second transistors to changes in the binary representation in the cell, and the pre-amplifier including means for unbalancing the transconductances of the third and fourth transistors in accordance with the provision of the first voltage on respective ones of the first and second output lines to expedite the frequency of response of the first and second transistors to changes in the binary representation in the cell, means for feeding a voltage back to the third and fourth transistors respectively from the first and second output lines to provide a negative feedback to the third and fourth transistors, and a fifth transistor providing a common connection to the third and fourth transistors to provide a first circuit branch including the first output line and the first, third and fifth transistors and to provide a second circuit branch including the second output line and the second, fourth and fifth transistors.

37. In combination,
a cell having first and second lines and constructed to provide a differential output and to provide a current through the first line for a representation of a first binary value and through the second line for a representation of a second binary value, first and second transistors respectively connected to the first and second lines for providing a transconductance in the transistors, first means operatively coupled to the first and second lines for respectively providing outputs in accordance with the current through the cell and the individual one of the first and second lines, and second means operatively coupled to the first and second transistors and the first means for reducing the transconductance at each instant of a particular one of the first and second transistors in accordance with the current from the cell through the individual one of the first and second lines and the particular one of the first and second transistors receiving the reduced transconductance at each instant being the transistor coupled to the line receiving the current from the cell, third and fourth transistors respectively coupled to the first and second transistors and to the first and second lines to reduce the transconductance at each instant of the particular one of the first and second transistors in accordance with the flow of current from the cell through the individual one of the first and second lines at that instant, the first and third transistors being connected in a first circuit to provide the transconductance in the first transistor, the second and fourth transistors being connected in a second circuit to provide the transconductance in the second transistor, means for providing a feedback from the output of the third transistor to the first transistor, means for providing a feedback from the output of the fourth transistor to the second transistor, the feedbacks to the first and second transistors reducing the transconductance at each instant of the particular one of the first and second transistors in accordance with the flow of current from the cell through the individual one of the first and second lines, and a fifth transistor connected to the first transistor in the first circuit to enhance the reduction of the transconductance in the first circuit and connected to the second transistor in the second circuit for enhancing the reduction of the transconductance in the second circuit.

38. In combination,
a cell having first and second lines and being differentially connected to produce a current through the first line in representation of a first binary value and through the second line in representation of a second binary value, a first transistor connected to the first line to provide a current through the first transistor in accordance with the flow of current through the first line, a second transistor connected to the second line to provide a current through the second transistor in accordance with the flow of current through the second line, a first output line connected to the first transistor to provide an output in accordance with the flow of current through the first transistor, a second output line connected to the second transistor to provide an output in accordance with the flow of current through the second transistor, first means connected to the first output line to provide a reduced transconductance to the first transistor relative to the transconductance to the second transistor with an output on the first output line, second means connected to the second output line to provide a reduced transconductance to the second transistor relative to the transconductance to the first transistor with an output on the second output line, the first and second means having a common connection, and means for providing a reference potential, means connected between the common connection between the first and second means and the reference potential means for facilitating the production of the reduced transconductances respectively in the first and second transistors.

* * * * *